United States Patent [19]
Battarel et al.

[11] 3,997,884
[45] Dec. 14, 1976

[54] MAGNETIC DOMAIN PROPAGATION REGISTER

[75] Inventors: Claude Battarel, Magagnosc; Jean-Pierre Nori, Toulouse, both of France

[73] Assignee: TECSI (Techniques et Systemes Information), Paris, France

[22] Filed: Feb. 25, 1975

[21] Appl. No.: 552,820

[30] Foreign Application Priority Data
Mar. 8, 1974 France .............................. 74.08012

[52] U.S. Cl. .................... 340/174 ZB; 340/174 FB; 340/174 SR; 340/174 TF
[51] Int. Cl.[2] .................. G11C 19/00; G11C 11/14
[58] Field of Search ............... 340/174 FB, 174 ZB, 340/174 TF

[56] References Cited
UNITED STATES PATENTS

| 3,739,358 | 6/1973 | Battarel ...................... 340/174 FB |
| 3,786,449 | 1/1974 | Jauvtis ......................... 340/174 FB |
| 3,786,451 | 1/1974 | Spain ............................ 340/174 ZB |
| 3,889,246 | 6/1975 | Battarel ...................... 340/174 FB |

*Primary Examiner*—James W. Moffitt
*Attorney, Agent, or Firm*—Sughrue, Rothwell, Mion, Zinn & Macpeak

[57] ABSTRACT

In digital registers for the propagation of magnetic domains in thin layers, one of the shift conductors is combined with an extra layer which is magnetically hard and which sets up a permanent field on the edge of that conductor, this facilitating the propagation of the domains.

7 Claims, 6 Drawing Figures

MAGNETIC DOMAIN PROPAGATION REGISTER

BACKGROUND OF THE INVENTION

1. Field of the Invention

This invention concerns memory devices for propagating domains in thin polycrystalline ferromagnetic layers having uniaxial anisotropy, deposited on an insulating substrate and more particularly an arrangement for facilitating domain propagation.

2. Description of the Prior Art

In a magnetic domain propagation register, propagation is effected in a "soft" magnetic zone having slight coercivity, with a suitable shape, surrounded by a magnetic zone having greater coercivity, under the control of a clock.

Co-pending U.S. application Ser. No. 372,866 filed on June 6, 1973, now U.S. Pat. No. 3,889,246, describes a register whose operation is identical to that of this application, for propagating magnetic domains in a zone formed by a magnetic layer having uniaxial anisotropy with slight coercivity, or soft zone, surrounded by a zone having greater coercivity, or hard zone, that register being of the type forming several parallel segments each of which comprises a central zone and, on each side, a lateral zone having divisions with edges which are alternately straight or inclined in relation to the axis of the central zone and comprising, in a functional combination:

1. A conductor, called the lateral conductor, in a Greek border configuration of sinuous form having several legs each of which covers alternately the divisions on one side and the divisions of the other side of the central zone and, possibly, the divisions on the opposite side of the adjacent segment having slight coercivity, that material conductor ensuring simultaneously the growth of the domains beneath one leg and the deleting of the domains beneath the adjacent leg;

2. A central conductor, in a Greek border configuration of sinuous form, having a width approximately equivalent to the said space between two legs of the lateral conductor, for example greater or smaller by 0 to 40%, in which one every other leg covers a central part of the segment or of the central parts of several segments, that control conductor ensuring the transfer of the domains from the divisions which are beneath one leg of the lateral conductor to the divisions which are beneath the adjacent leg.

In such a register, a system having two conductors is therefore sufficient to ensure the propagation of the domains in a thin magnetic layer structure in which zones having a low coercitive field in the shape of teeth having an oblique slope, which are asymetrical, channel the unilateral direction of movement of the domains. The conductor on the first level, called the central conductor, enables, when a current of one polarity crosses through it, the growth of the domains in the central zone of the propagation channels, in the soft layer.

The conductor on the second level, called the lateral conductor, is crossed by pulses of bipolar current which enable, simultaneously, the growth of a domain in a top finger of the channel and the deleting of the other end of the same domain in a bottom finger of the channel. The data is kept in the form of a domain whose magnetization is anti-parallel to the general reset to zero direction of the magnetization, itself parallel to the easy axis of the soft magnetic layer. The uniaxial anisotropy is induced at the time of the depositing by a 50-Oersted magnetic field.

The data bearing domain is kept in a finger of the channel and its size is greater than the critical size beneath which a domain is spontaneously deleted, mainly under the effect of the demagnetizing field set up by the magnetic charges of opposite sign existing at the two points of the domain. More particularly, for a soft layer of coercitive field equal to 3 Oersteds, domains of 10 $\mu$ × 100 $\mu$ will be stable.

The preserving of smaller domains would be possible if an outside field were maintained in the direction of the magnetization of the domain, for example, an outside field of 2 Oersteds would enable the preserving of a 5 $\mu$ × 30 $\mu$ domain and therefore the increasing of the density of storage by a large factor.

SUMMARY OF THE INVENTION

The present addition therefore aims at increasing the density of storage in a propagation register according to the referred to application. According to this addition, a hard extra magnetic layer is deposited in strips parallel to the axis of difficult magnetization of the soft zone at a certain distance from the latter. To great advantage, that distance is chosen between 5 and 50 microns and preferably of about 15 microns.

In a preferred embodiment of that addition, the mask for the depositing of the extra layer is identical to that which is used for the lateral conductor.

It is possible either to superimpose that layer on the conductor, or to superimpose the conductor on that layer, or, even, to interpose that layer between two conductive strips which, together, would constitute the conductor.

This addition will be described hereinbelow in greater detail with reference to six figures.

DESCRIPTION OF PREFERRED EMBODIMENTS

Figure 1:
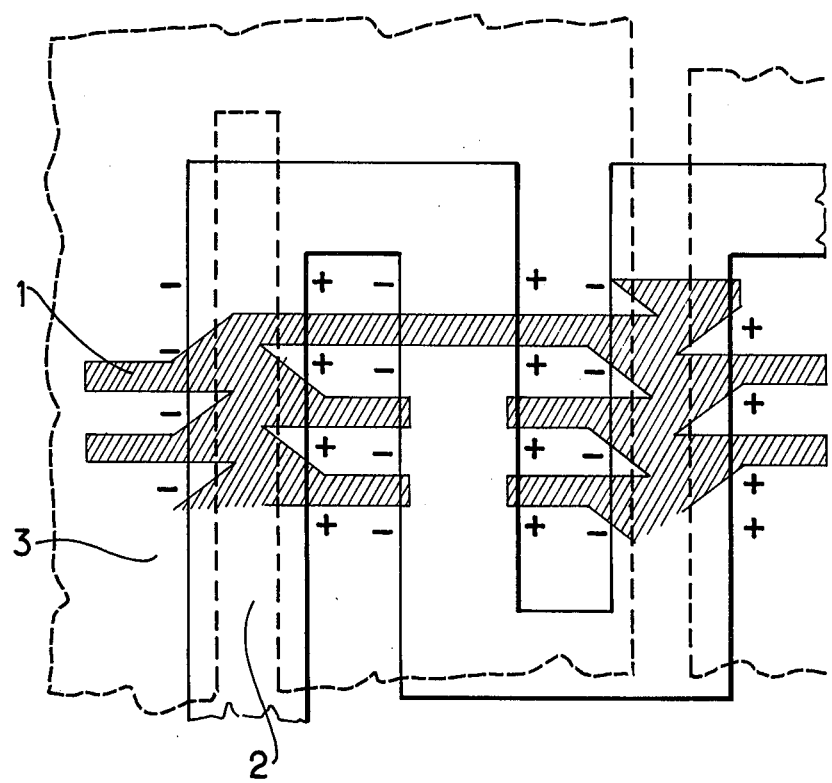
FIG. 1 shows a diagrammatic plan view of one embodiment of the register of the present invention.

FIG. 1 shows the structure of the invention. The magnetic channel 1, the central conductor 2 and the lateral conductor 3 in accordance with the referred to application, can be seen. The base substrate can be a glass, ceramic or metallic plate. The glass plate is the most economical solution, enabling also, the observing of the domains under the Kerr effect, from beneath the substrate.

Figure 2:
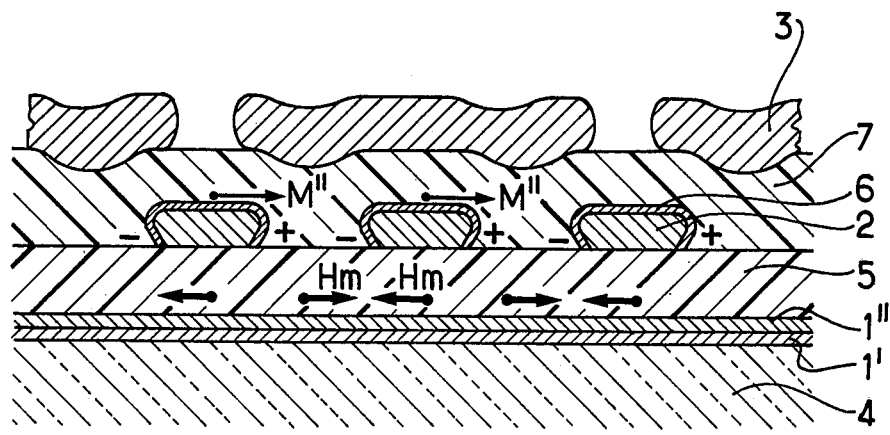
FIG. 2 is a cross-section of a register according to FIG. 1.

FIG. 2 shows better the various components of a register in a cross-section view conforming to that of FIG. 1. The magnetic channel 1, which is placed directly on a base substrate 4 is constituted by an even soft layer 1' and by a hard layer 1" superimposed on the soft layer. The latter, for example, a chemical deposit in an orientation field of 50 Oersteds of 55/42/3 Ni/Co/P alloy, having a thickness of 1000 A, has a coercitive field of 3 Oersteds and an anisotropy field of 30 Oersteds.

The hard magnetic layer 1'', for example a 97/3 Co/P chemical deposit, having a thickness of 700 A, has a coercitive field of 1300 Oersteds. It is interrupted at the points where there are channels 1 for the propagation of domains in the soft layer. Since the channels must be surrounded by hard magnetic material, it is conventional in facilitating such fabrication to deposit primarily a soft layer on the entire surface of the substrate 4 and to cover this layer by hard magnetic material except for the area of the soft panel, as evidenced by the hatched area in FIG. 1, conventionally a masking technique need only be applied when depositing the hard magnetic layer.

A first insulating layer 5, for example a polyimide having a thickness of 15 $\mu$ is deposited on that assembly, on the top of which is applied the central conductor 2, consisting of an electrolytic deposit of copper having a thickness of 7 $\mu$. The central conductor is covered by a hard magnetic layer 6 according to this application. That magnetic layer 6 has an intermediate coercitive field between the coercitive field of the first hard layer 1'' (1300 Oersteds) and the coercitive field of the soft layer 1' (30 Oersteds); it has, for example, a coercitive field of 200 Oersteds.

The orientation of the magnetization in the first hard layer 1'' is obtained by applying a magnetic field of 1500 Oersteds in a direction parallel to the easy axis of the soft layer, whereas the orientation of the magnetization in the second hard layer 6 is obtained by the magnetization of that layer by means of a magnetic field of 300 Oersteds in the opposite direction. In this way, the magnetization of the first hard layer 1'' is not disturbed during magnetization of the second hard layer 6.

That hard layer 6 enables the applying, permanently, of a magnetic field of about 2 Oersteds to the fingers of the channel in the direction of the magnetization of the domains and a magnetic field, also of about 2 Oersteds, in the central zone of the channel in the direction of the deletion of the domains. These magnetostatic fields promote the operation of the register, on the one hand, the deleting of the points of domains in the central zone is made easier and, on the other hand, the domains are better preserved in the fingers and their smaller critical size makes it possible to increase the density of storage, which may reach 50,000 bits per squ. cm.

The applying of the control current in the central conductor 2 sets up a maximum field of 20 Oersteds at the level of the hard extra layer 6 and therefore does not disturb the magnetization thereof.

In FIG. 2, it will be seen that the magnetization M'' of the hard extra layer 6 sets up a magnetic charge line +++++, -----, on each edge of the central conductor 2.

That configuration of static charges sets up a magnetostatic field configuration Hm which is in the direction of the deleting of the domains beneath the segments of the central conductor and in the direction of the growth of the domains between the segments. This promotes the preservation of the data in the fingers and makes the operation of the register easier, as shown above.

The central conductors 2 are lastly covered by a second insulating layer 7, also made of a polyimide having a thickness of 15 $\mu$, on which is deposited the lateral conductor 3 constituted by an electrolytic layer having a thickness of 14 $\mu$.

Figure 3:
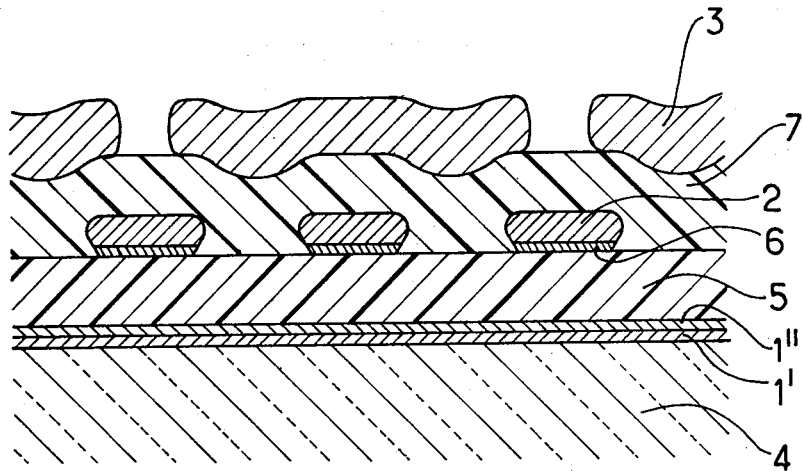
FIG. 3 is a cross-section of a variant of the register according to the present invention.
Figure 4:
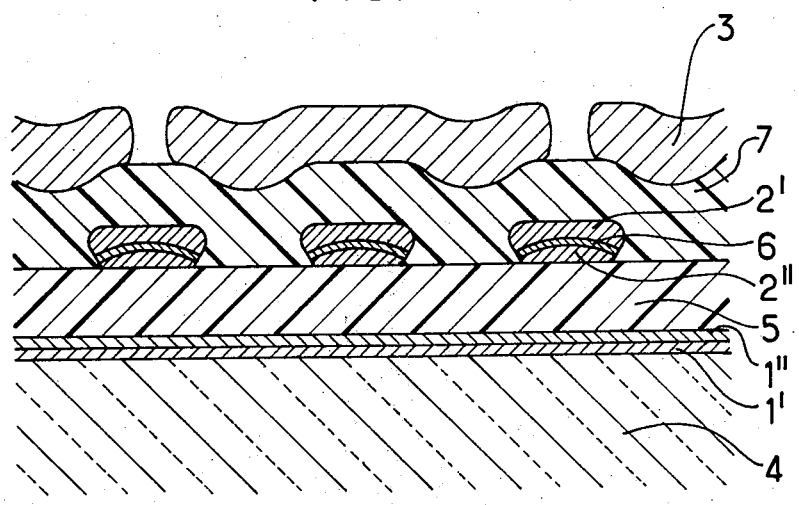
FIG. 4 is a cross section of a third embodiment of the present invention.

The variants of the invention consist in depositing the extra magnetic layer beneath the central conductor or at any level between two conductive strips 2' and 2'' which constituted the central conductor, as shown in FIGS. 3 and 4 which show a cross-section of these variants, using the same reference numerals for like elements as in FIGS. 1 and 2. The configuration of Hm and the effect being the same at the level of the soft layer, the operation of the register and the improvement obtained by the second hard layer are similar in the case of FIGS. 1 and 2.

Figure 5:
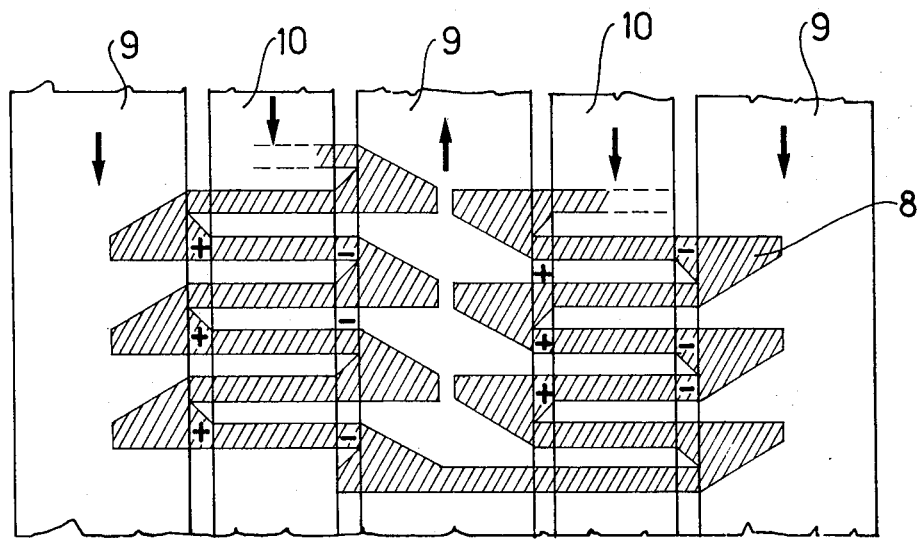
FIG. 5 is a plan diagrammatic view of another embodiment of a register according to this invention.
Figure 6:
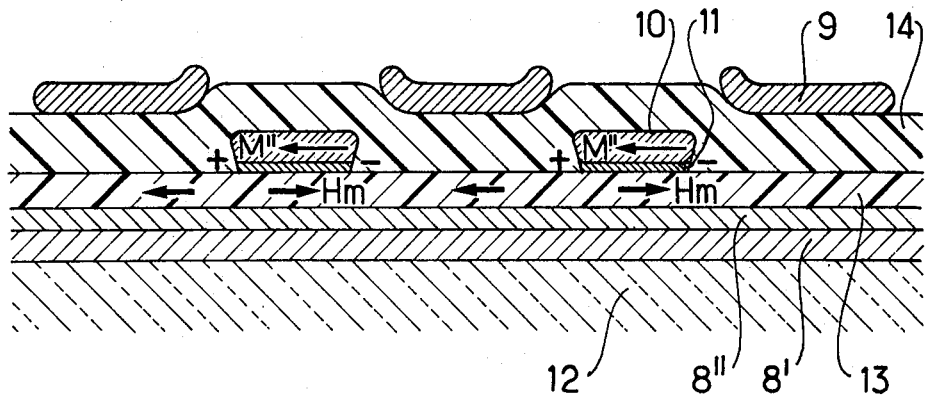
FIG. 6 is a sectional view of a register conforming to that of FIG. 5.

Another variant of the invention is shown in FIGS. 5 and 6; the low coercivity magnetic channel 8, in FIG. 5 in which the domains propagate is such that the data preservation divisions have been shortened on one side and extended on the other, to join together two divisions having an oblique slope so as to preserve the data in the divisions along the easy axis which form the central zone and to preserve the domains in a transitory manner only in the divisions having oblique slopes which are placed beneath a lateral conductor 9. The central conductor 10 has as many legs in parallel as there are rows in the register, namely, two in FIGS. 5 and 6 and bipolar current pulses cross through it. The presence of a hard magnetic layer 11 on or beneath the central conductor 10 orientated by the magnetic field which is used for orientating the hard magnetic layer 8'' FIG. 6 sets up a magnetic field in the direction of the magnetization of the domains in the central divisions and therefore promotes the preserving of the small-sized domains in the soft layer 8'. In the case of that variant, the magnetic layer 11 may be of the same kind as the magnetic layer 8''. That same magnetic layer 11 sets up a deleting field for the domains in the divisions having oblique slopes, thus assisting the demagnetization field set up by the layer 8'' at the places when there are oblique slopes whose action is necessary for deleting the downstream point of the domain which has just grown in such a division and thus prevent its backwards return to the central division from which the domain comes. As in the preceding cases, the register is placed on a glass substrate 12 and the central conductors 10 are arranged between two insulating layers 13 and 14.

The arrangement of strips of hard magnetic layer above a memory structure using magnetic domains to represent data will enable the preservation of small-sized domains, whatever the particular structure of the memory point may be, on condition that it have an at least partly open flux.

We claim:
1. In a register for propagating magnetic domains in a zone formed by a magnetic layer having uniaxial anisotropy with slight coercivity, or soft zone, surrounded by a zone having greater coercivity, or hard zone, that register being of the type forming several parallel segments each of which comprises a central zone and, on each side a lateral zone having divisions with edges which are alternately straight and inclined in relation to the axis of the central zone and comprising, in a functional combination:

a lateral conductor, in sinuous configuration having several legs each of which covers alternately at least the divisions on one side and at least the divisions of the other side of the central zone and ensuring simultaneously the growth of the domains beneath one leg and the deleting of the domains beneath the adjacent leg;

a central conductor, in a sinuous configuration, having a width approximately equivalent to the space between two legs of the lateral conductor, for example greater or smaller by 0 to 40%, in which every other leg covers a central part of at least one segment, said central conductor ensuring the transfer of the domains from the divisions which are beneath one leg of the lateral conductor to the divisions which are beneath the adjacent leg, the improvement comprising: a hard extra magnetic layer arranged in strips parallel to the difficult magnetization axis of the soft zone at a given distance from the latter.

2. The register according to claim 1, wherein the central zone comprises assymetrical teeth laid so as to form strips parallel to the easy axis beneath the central conductor with the oblique segments of the teeth lying beneath the lateral conductor.

3. The register according to claim 1, wherein: said distance is between 5 and 20 microns.

4. The register as claimed in claim 3, wherein said distance is about 15 microns.

5. The register according to claim 1 wherein the hard extra magnetic layer is a deposited layer identical to that for the central conductor so that this layer and the conductor are superimposed.

6. The register according to claim 5, wherein the hard extra magnetic layer is in contact with at least one of the surfaces of the central conductor.

7. The register according to claim 5, wherein the hard extra magnetic layer is interposed between two conductive strips which constitute, together, the central conductor.

* * * * *